United States Patent [19]
Inoue

[11] Patent Number: 6,098,861
[45] Date of Patent: Aug. 8, 2000

[54] BREAKING APPARATUS FOR CERAMIC BOARD

[75] Inventor: Eiji Inoue, Fukuoka, Japan

[73] Assignee: Rohm Co., Ltd., Kyoto, Japan

[21] Appl. No.: 09/063,144

[22] Filed: Apr. 20, 1998

[30] Foreign Application Priority Data

Apr. 22, 1997 [JP] Japan ................................. 9-105028

[51] Int. Cl.[7] .................................................. B26F 3/00
[52] U.S. Cl. ........................................ 225/96.5; 225/93
[58] Field of Search ............................. 225/96.5, 104, 225/103, 100, 98, 93

[56] References Cited

U.S. PATENT DOCUMENTS

| | | | |
|---|---|---|---|
| 1,319,080 | 10/1919 | Hottmann | 225/98 |
| 3,300,112 | 1/1967 | Tailleur et al. | 225/96.5 X |
| 3,494,523 | 2/1970 | Kalvelage | 225/96.5 X |
| 3,693,852 | 9/1972 | Simomura | 225/96.5 X |
| 3,743,149 | 7/1973 | Groppe | 225/96.5 X |
| 4,109,841 | 8/1978 | DeTorre | 225/96.5 |
| 4,131,222 | 12/1978 | Hodgkinson | 225/96.5 X |
| 4,195,758 | 4/1980 | Morgan | 225/98 |
| 4,306,672 | 12/1981 | Johannes | 225/96.5 X |
| 4,948,025 | 8/1990 | Lisec | 225/104 |

OTHER PUBLICATIONS

Shigley and Mischke, Mechanical Engineering Design, 5th Edition, McGraw–Hill Inc., pp. 678–679, 1989.

Primary Examiner—Kenneth E. Peterson
Attorney, Agent, or Firm—Jordan and Hamburg LLP

[57] ABSTRACT

A breaking apparatus for a ceramic board includes a feeding belt having plural rack-shaped tooth rows each comprising many teeth formed on the lower surface of the feeding belt, and a break pulley having plural pinion-shaped tooth rows each comprising many teeth which are engaged with the respective teeth in the tooth rows and provided on the peripheral surface of the break pulley, the engagement position between each tooth in the plural tooth rows of the feeding belt and each tooth of the plural tooth rows of the break pulley being positionally arranged in an offset manner every row.

22 Claims, 9 Drawing Sheets

BREAKING APPARATUS FOR CERAMIC BOARD

BACKGROUND OF THE INVENTION

1. Field of the Invention

The present invention relates to an apparatus for use in manufacturing of chip type electrical parts, and particularly to a breaking apparatus for dividing into bar-shaped boards a ceramic board having break grooves.

2. Description of the Related Art

As shown in FIGS. 8 and 9, in a breaking apparatus 100 for dividing a ceramic board 200 into bar-shaped boards 210, right and left feeding belts 110 are disposed in parallel to each other, and a press belt 120 is overlaid on each of the feeding belts 110 from the upper side. A ceramic board 200 having break grooves 201 formed therein is fed by both the belts 110 and 120 while sandwiched between both the belts 110 and 120. A break pulley 300 is pressed against the lower surfaces of each of the feeding belts 110 to bend the belts 110 and 120.

The ceramic board 200 is divided into many bar-shaped boards 210 along the break grooves 201 by the belts 110, 120 which are bent by the break pulleys 300. Further, the back surface of each feeding belt 110 is provided with a rack-shaped tooth row 130 having many teeth 140 arranged at fixed intervals so that the press face of the break pulley 300 does not slip along the back surface of the feeding belt 110, thereby preventing the ceramic board 200 during feeding from being slipped and positionally arranged in an offset manner. Further, a pinion-shaped gear tooth row 310 comprising many gear teeth 320 is projected on the outer periphery of the break pulley 300 so that the gear teeth 320 are engaged with the gear teeth of the feeding belts 110.

The tooth row 130 of the feeding belt 110 comprises thick projecting portions 141 which are formed as the teeth 140 and are stiff, and recess portions 142 which are formed between the respective teeth 140 and are flexible. When the feeding belts 110 are bent along the peripheral surface of the break pulley 300, the curvature of the feeding belts 110 is smaller at the projecting portions 141 thereof and larger at the recess portions 142 thereof.

Accordingly, when the ceramic board 200 sandwiched between each feeding belt 110 and each press belt 120 just passes over the bent portions of the feeding belts 110 in the dividing process of the ceramic board 200, if the breaking groove 201 is located at the recess portion 142, the ceramic board 200 is readily divided because the curvature is large. However, if the breaking groove 201 is located at the projecting portion 141, the ceramic board 200 is not accurately divided into the bar-shaped board 210 or cracks occur in the divided face because the curvature is small.

Accordingly, the break grooves 201 of the ceramic board 200 are desired to be located at the recess portions 142 having the larger curvature at all times.

However, the break grooves 201 of the ceramic board 200 are not necessarily located at the recess portions 142 having the larger curvature at all times during feeding, and it is randomly determined whether any breaking groove 201 is located at the projecting portion 141 having the small curvature or at the recess portion 142 having the large curvature.

Particularly, since the gear teeth 320, in the respective gear teeth rows 310 which are provided on the right and left break pulleys 300, are arranged so as to be positionally coincident with each other, the probability that any break groove 201 is located at the portion of the tooth 140 in each tooth row 130, that is, at the projecting portion 141 having the small curvature is approximately equal to ½, and thus the division efficiency is lowered.

In order to prevent the foregoing trouble, the press force of the press belts 120 may be enhanced. However, if the press force is enhanced, some cracking occurs in the travel direction (feeding direction) of the ceramic board 200, resulting in defective articles. Further, if the press force of the press belts 120 are enhanced, the press force is also transmitted and the feeding belts 110 and severely wears the teeth 140 in the teeth rows 130 provided on the feeding belts 110 and the gear teeth 320 in the gear teeth rows 310 provided on the break pulleys 300, and although various countermeasures have been taken, such severe wearing cannot be sufficiently prevented.

SUMMARY OF THE INVENTION

Therefore, according to the present invention, a breaking apparatus for a ceramic board in which press means for clamping a ceramic board is provided at the upper side of a feeding belt, and the break pulley is pressed against the lower surface of the feeding belt to divide the ceramic board sandwiched between the feeding belt and the press means into many bar-shaped boards while the feeding belt is bent along the peripheral surface of the break pulley; wherein: teeth in plural rack-shaped rows are provided on the lower surface of the feeding belt; teeth in plural pinion-shaped rows are provided on the peripheral surface of the break pulley.

Further, the present invention has the following features.

A position of engagement where the teeth in each row of said plural rack-shaped rows of said feeding belt and the teeth in each row of said plural pinion-shaped rows of said break pulley are engaged is arranged in an offset manner in said plural row.

There are provided two feeding belts, that is, a right toothed belt and a left toothed belt, the lower surface of each toothed belt is provided with a tooth row, and there is provided a break pulley which is provided with plural tooth rows in correspondence with the tooth rows of each toothed belt on the peripheral surface thereof.

The feeding belt comprises a wide toothed belt, the lower surface of the toothed belt is provided with plural tooth rows, and there is provided a break pulley which is provided with plural tooth rows in correspondence with the tooth rows of the toothed belt on the peripheral surface thereof.

The break pulley comprises two break pulleys, that is, a right break pulley and a left break pulley, and the two break pulleys are disposed at right and left sides of a pulley shaft, respectively.

The break pulley comprises a wide break pulley, and the surface of the break pulley is provided with plural tooth rows which correspond to the plural tooth rows provided on the toothed belt.

The press means comprises a press belt, and the press force of the feeding belt by the press belt is made adjustable.

According to the present invention, plural rack-shaped tooth rows with many teeth are provided on the back surface of the feeding belt, and also plural pinion-shaped tooth rows with many teeth which are respectively engaged with the teeth in the teeth rows on the feeding belt are provided on the peripheral surface of the break pulley. In addition, a position of engagement where the teeth in each row of said plural rack-shaped rows of said feeding belt and the teeth in each row of said plural pinion-shaped rows of said break pulley are engaged is arranged in an offset manner in said plural row.

Specifically, the feeding belt is constructed by two belts of a right toothed belt and a left toothed belt, and right and left break pulleys provided with pinion-shaped tooth rows having the teeth which are located so as to be positionally arranged in an offset manner by ½ pitch in each rows are pressed to the lower surfaces of the right and left toothed belts respectively, and also the teeth in each rack-shaped tooth rows provided on the lower surfaces of the right and left toothed belts are located so as to be positionally arranged in an offset manner by ½ pitch in each rows so that the tooth rows of the break pulleys and the tooth rows of the feeding belts are engaged with each other.

Since breaking grooves are formed on the ceramic board before division which is sandwiched between each feeding belt and each press belt, the probability that any breaking groove is located at the recess portion of the tooth row provided on the lower surface of any one of the right and left feeding belts is enhanced because the tooth position is arranged in an offset manner between the right and left feeding belts by ½ pitch, so that the ceramic board can be accurately divided even when the press force for breaking is not so strong.

Generally speaking, a crack which occurs at any one of the right and left end portions of a breaking groove is rapidly grown and instantaneously reaches the other end portion because of breaking pressure. Therefore, it is unnecessary to simultaneously generate cracks at both the end portions of the breaking groove, and the ceramic board can be sufficiently divided even when a crack is generated only at one end portion of the breaking groove.

The breaking apparatus of the present invention is based on the foregoing principle. Further, the following structure is adopted to change the press force of the press belt serving as the press means. That is, a press unit, comprising three pulleys and a press belt which is wound around the outer peripheries of the three pulleys, is provided above each break pulley. One of the pulleys is interlockingly linked to an elevating mechanism so that the tension of the press belts is variable, and the feeding belt on the break pulley is pressed by the press belt located between the other pulleys.

DETAILED DESCRIPTION OF THE PREFERRED EMBODIMENTS

Preferred embodiments according to the present invention will be described hereunder with reference to the accompanying drawings.

A breaking apparatus A according to the present invention is used in a process of dividing a ceramic board C into bar-shaped boards C3 along breaking grooves C1.

Figure 1:
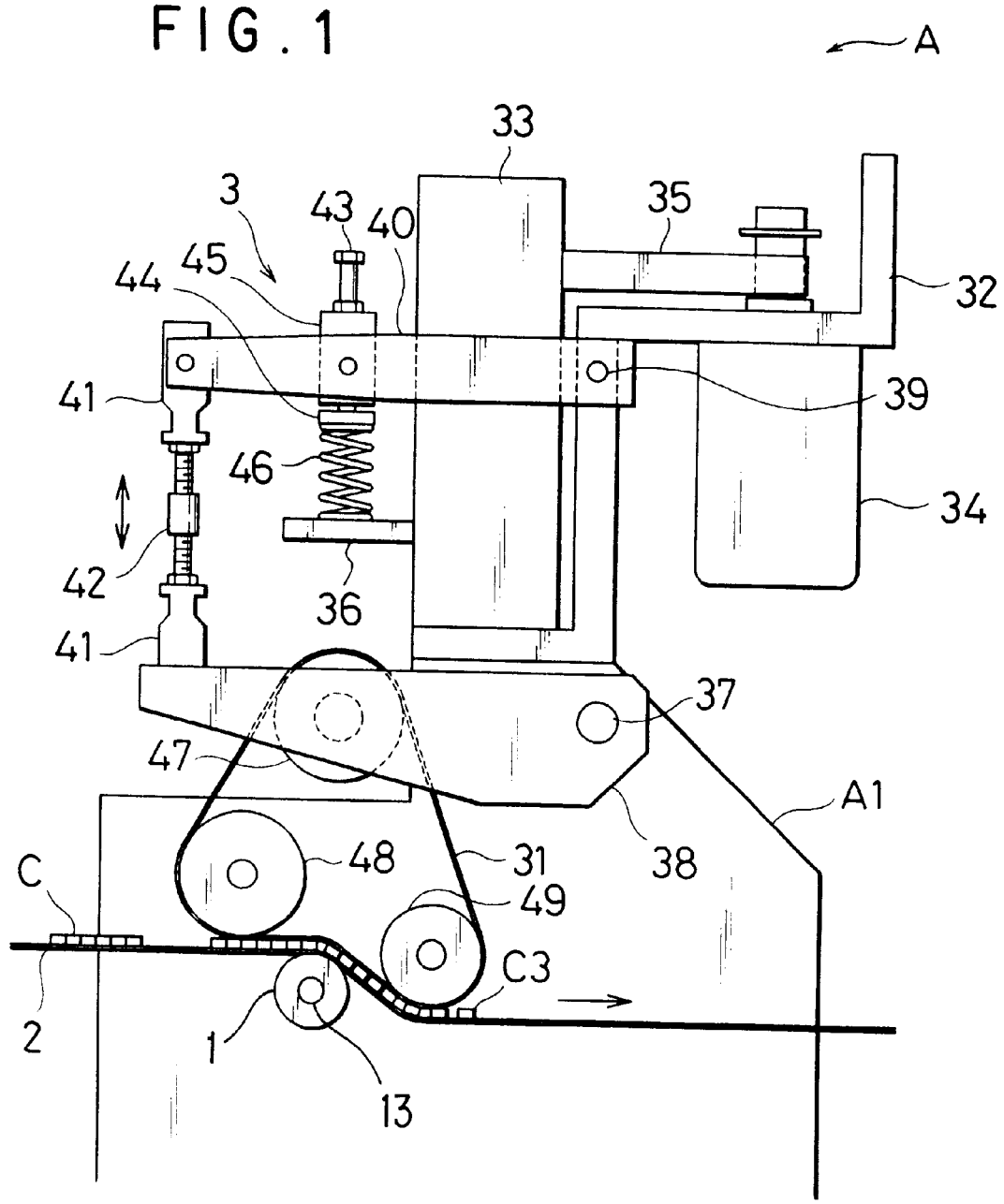
FIG. 1 is a side view showing a breaking apparatus for a ceramic board according to the present invention.
Figure 2:
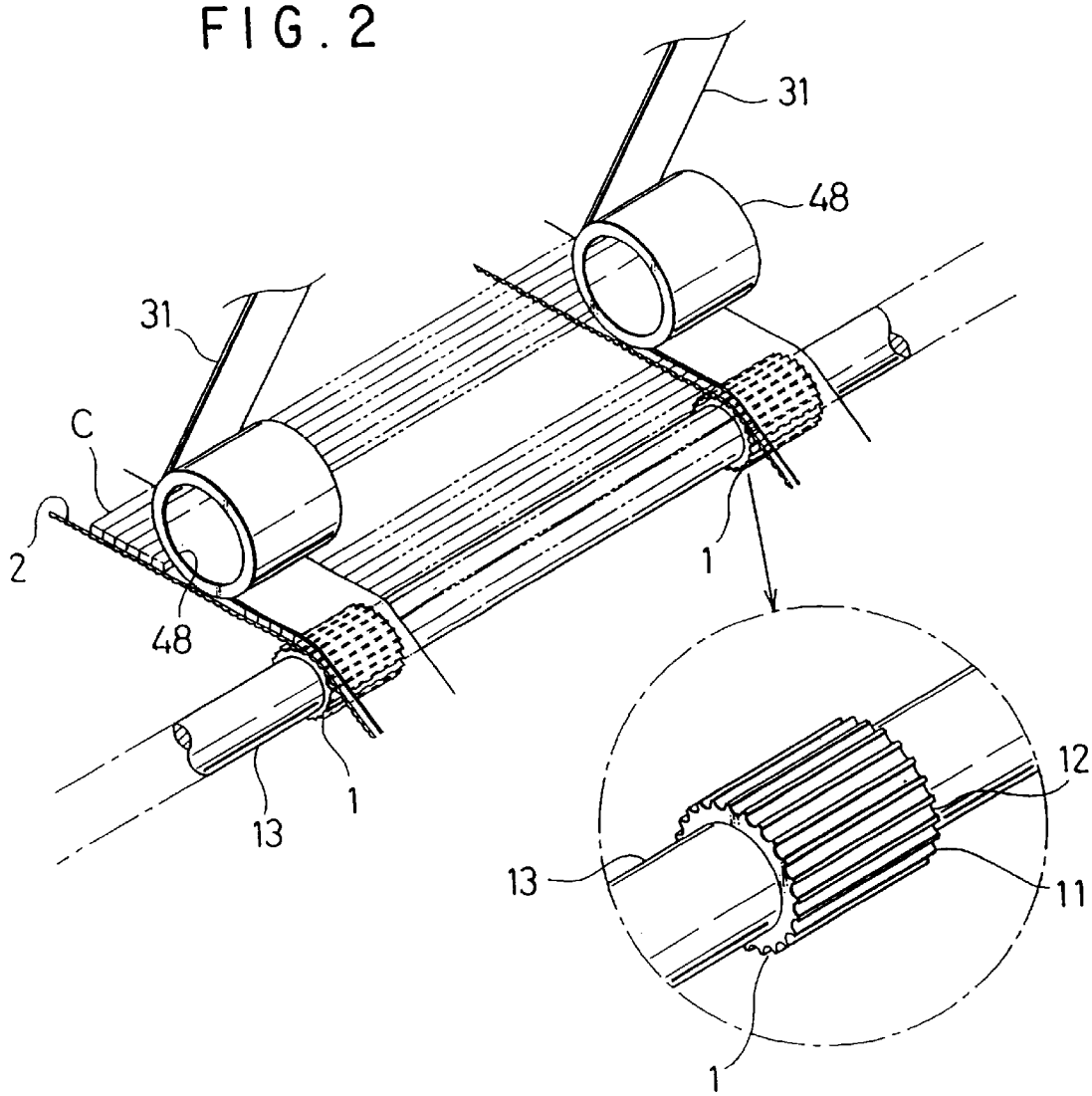
FIG. 2 is a perspective view showing the breaking apparatus shown in FIG. 1.
Figure 3:
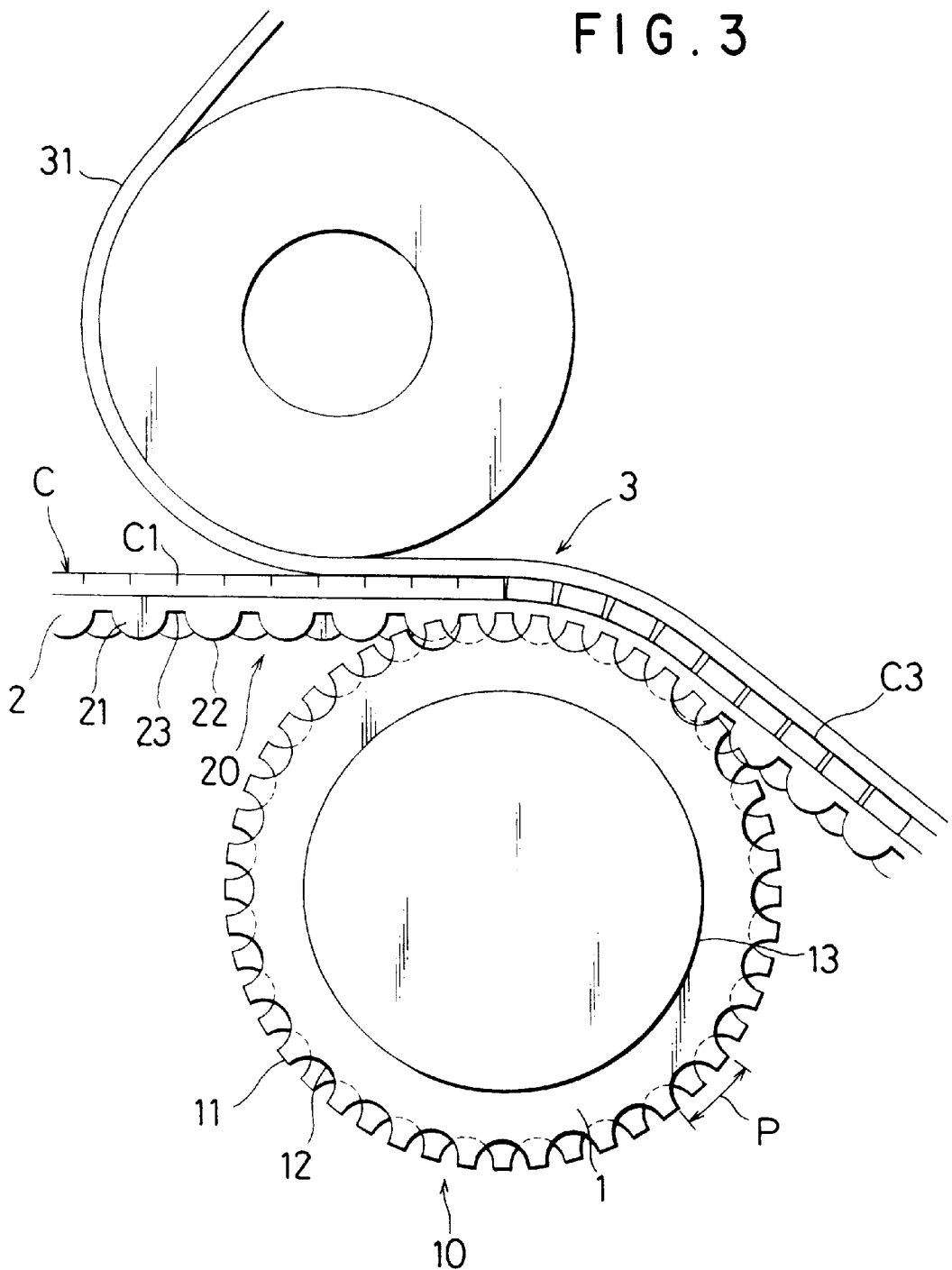
FIG. 3 is a side view showing a feeding belt and a break pulley.

FIG. 1 is a side view showing a main part of the breaking apparatus A according to the present invention, FIG. 2 is a perspective view showing the main part of the breaking apparatus A and FIG. 3 is a side view showing a break pulley 1 and a feeding belt 2.

As shown in FIGS. 1 and 2, the breaking apparatus A comprises right and left feeding belts 2, press belts 31 serving as press means which are disposed above the right and left feeding belts 2, and right and left break pulleys 1 which are pressed against the lower surfaces of the right and left feeding belts 2.

A ceramic board before division which is mounted on the upper surfaces of the right and left feeding belts 2 and is fed to the position above the right and left break pulleys 1, and sandwiched between the right and left feeding belts 2 and the press belts 31 which are pressed against the right and left feeding belts 2 respectively. Reference numeral 3 represents a press machine for pressing the press belts 31 against the upper surfaces of the feeding belts 2.

When the right and left feeding belts 2 and the press belts 31 are fed to the right and left break pulleys 1, they are bent along the peripheral surfaces of the break pulleys 1, and the ceramic board C, which is pressed against the upper surfaces of the feeding belts 2 by the press belts 31, is divided into many bar-shaped boards C3 along the breaking grooves C1.

As shown in FIGS. 2 and 3, each of the right and left break pulleys 1 is constructed like a pinion which by a tooth row 10 comprising teeth 11 which are arranged at a fixed pitch p on the outer periphery thereof and recess portions 12 between the teeth 11. Each recess portion 12 is designed in a substantially semicircular shape. The right and left break pulleys 1 are pivotally supported by the end portions of a pulley shaft 13 which is disposed below and proximite to the right and left feeding belts 2.

Particularly in the right and left break pulleys 1, the teeth 11 in the tooth rows 10 are located so as to be positionally arranged in an offset manner between the right and left break pulleys 1 in the range of one pitch p in the peripheral direction. Therefore, when viewed from the longitudinal direction of the pulley shaft 13, the teeth 11 in the tooth rows 10 are not positionally coinsident between the right and left break pulleys 1 (in this embodiment, the teeth of the right and left break pulleys 1 are positionally arranged in an offset manner by a half of the pitch P).

Further, as shown in FIGS. 2 and 3, each of the right and left feeding belts 2 comprises a toothed belt which has a rack-shaped tooth row 20 comprising many teeth 21 on the lower surface thereof, and the teeth 21 in each tooth row 20 are engaged with the teeth 11 of the gear tooth row 10 of the corresponding break pulley 1. Accordingly, the feeding belts 2 bend in a downward slated direction as viewed form a side view, and extend parallel to each other in the travel direction.

Each tooth row 20 of the feeding belts 2 is provided with thick projecting portions 22 serving as the teeth 21 which are projected in a substantially semicircular shape so as to be engaged with the recess portions 12 in the tooth row 10 of the break pulleys 1, and also thick recess portions 23, which are engaged with the teeth 11 in the tooth row 10 of the breaking pulleys 1, are formed between the projecting portions 22. The projecting portions 22 are hardly bent, and the recess portions 23 are easily bent. Accordingly, when the feeding belts 2 are pressed against the break pulleys 1, the feeding belts 2 are not bent in an arcuate shape, but are bent in a polygonal shape.

As shown in FIG. 3, the width of the projecting portions 22 of the teeth 21 of the tooth rows 20 formed on the feeding belts 2 is set to be larger than the width of the recess portions 23 (in this embodiment, it is set to about three times in width). Accordingly, when the feeding belts 2 are bent while pressed against the break pulleys 1, the curvature of the recess portions 23 on the upper surfaces of the right and left feeding belts 2 is set to be larger than the curvature of the projecting portions 22.

As shown in FIG. 1, the press machine 3 has a press portion frame 32 which is substantially Z-shaped in section in side view and mounted on an upper projecting portion of a machine frame A1, and an elevating mechanism 33 mounted at the left bottom portion of the press portion frame 32. The elevating mechanism 33 contains a freely-rotatable threaded rod and a nut which is engagedly disposed on the rod. Further, an electric motor 34, which is suspended at the right upper portion of the press portion frame 32, is interlockingly linked to the screw through the toothed belt 35, and the elevating arm 36 is driven by the rotation of the electric motor 34 so as to move upwardly and downwardly.

A lower pivot shaft 37 is provided at the upper projecting portion of the machine frame A1, and the right end portion of a lower link lever 38 is pivotally secured to the lower pivot shaft 37. In addition, an upper pivot shaft 39 is provided at the upper portion of the press portion frame 32, and the right end portion of the upper link lever 40 is pivotally secured to the upper pivot shaft 39 so as to be freely rotatable. Further, the left end portion of the lower link lever 38 and the left end portion of the upper link lever 40 are linked to each other by a freely-extendable link rod 42 which is threaded into rod ends 41 at both ends thereof, thereby forming a parallel link mechanism. An elastic adjustment mechanism 45 for moving a spring supporter 44 upwardly and downwardly by the screw motion of an adjustment screw 43 is pivotally secured in the middle of the upper link lever 40, and a press spring 46 is interposed between the spring supporter 44 and an elevating arm 36. Further, an upper pulley 47 is freely rotatably supported in the middle of the lower link lever 38.

The press belt 31 is wound in a substantially triangular shape around the upper pulley 47, a front pulley 48 which is pivotally mounted at the upper left position of each break pulley 1 of the frame A1, a back pulley 49 which is pivotally secured behind each break pulley 1 and at a lower position than the front pulley 48, and the feeding belts 2 and the ceramic board C which is fed by the feeding belts 2 are pressed toward the break pulleys 1 by the portion of each press belt 31 which corresponds to the bottom side of the triangle, whereby the travel direction of the ceramic board c and the feeding belts 2 is changed from the substantially horizontal direction to the downward slanted direction.

The press force of the press belt 31 as described above is adjustable by the upward and downward motion of the elevating arm 36 which is caused by the rotation of the electric motor 34, and thus the control of the press force can be automated.

The initial setting of the press force may be performed by expanding or contracting the link rod 42, and the elasticity of the press force can be adjusted by the screw motion of the adjustment screw 43 of the elastic adjustment mechanism 45.

Figure 4:
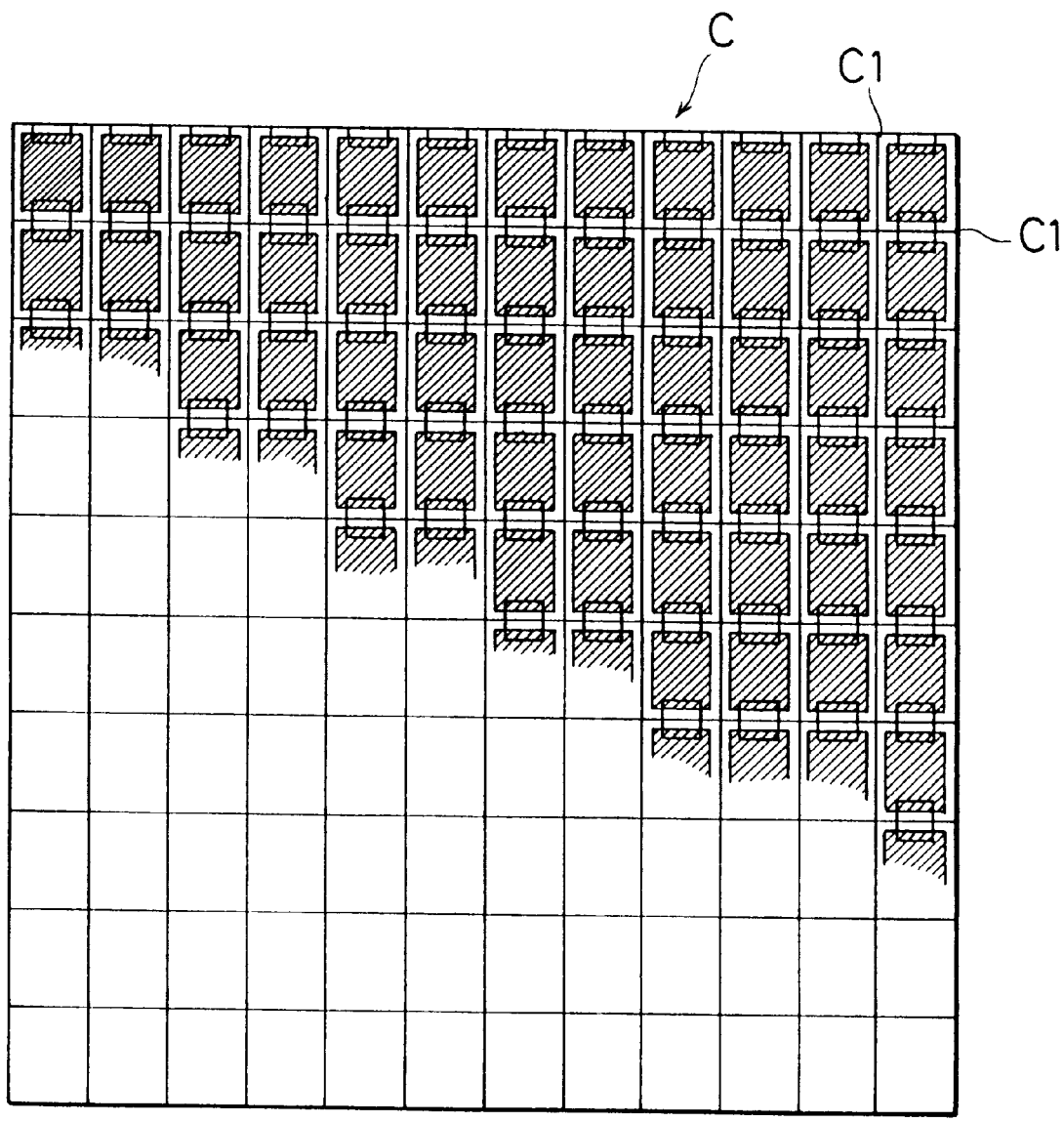
FIG. 4 is a plan view showing a large-size ceramic board.

FIG. 4 shows the ceramic board C which is divided into plural bar-shaped boards by the break apparatus A of this embodiment, and break grooves C1 are formed on the surface of the ceramic board C so as to be intersected to one another in the longitudinal and lateral directions.

The embodiment of the present invention is constructed as described above. The ceramic board C is fed while mounted on the upper surfaces of the feeding belts 2. When the ceramic board C arrives at the gap between the feeding belts 2 and the press belts 31, it is pressed against the upper surfaces of the feeding belts 2 by the press belts 31 and sandwiched between both the belts 2 and 31.

The ceramic board C, which is sandwiched between the feeding belt 2 and the press belt 31, travels further and arrives at the bent position defined by the break pulleys 1. At that position, the ceramic board C is bent along the breaking grooves C1 perpendicular to the travel direction.

Accordingly, the ceramic board C is divided into many bar-shaped boards C3 along the breaking grooves C1 from the breaking groove C1 at the front end of the travel direction, and the bar-shaped boards C3 thus obtained are fed in the travel direction while mounted on the feeding belts 2.

In the dividing process of the ceramic board C, when a breaking groove C1 on the ceramic board C is located at a recess portion 23 of at least one of the feeding belts 2 which are bent along the right and left break pulleys 1, the recess portion 23 has a large action on the bending of the break groove C1 because it has a large curvature, and thus the success rate of the division of the ceramic board is high. On the other hand, when the break groove C1 is located at a projection portion 22, the projection portion 22 has a small action on the bending of the ceramic board because it has a small curvature, and thus the success rate of the division of the ceramic board is low.

In this embodiment, the teeth 11 in the tooth row 10 which are provided on the right and left break pulleys 1 at both end portions of the pulley shaft 13 are located so as to be arranged in an offset manner from one another in the peripheral direction by a ½ pitch, and thus the probability that any one of the end portions of any break groove C1 is located at any recess portion 23 of the right and left feeding belts 2 is enhanced, so that the success rate of the division of the ceramic board C is enhanced.

When the ceramic board C is divided, a crack occurs at one end portion of the ceramic board C and is rapidly grows under the breaking pressure and instantaneously reaches the other end portion to complete the division. Therefore, it is unnecessary to simultaneously generate cracks at both the end portions of the breaking groove.

Figure 5:
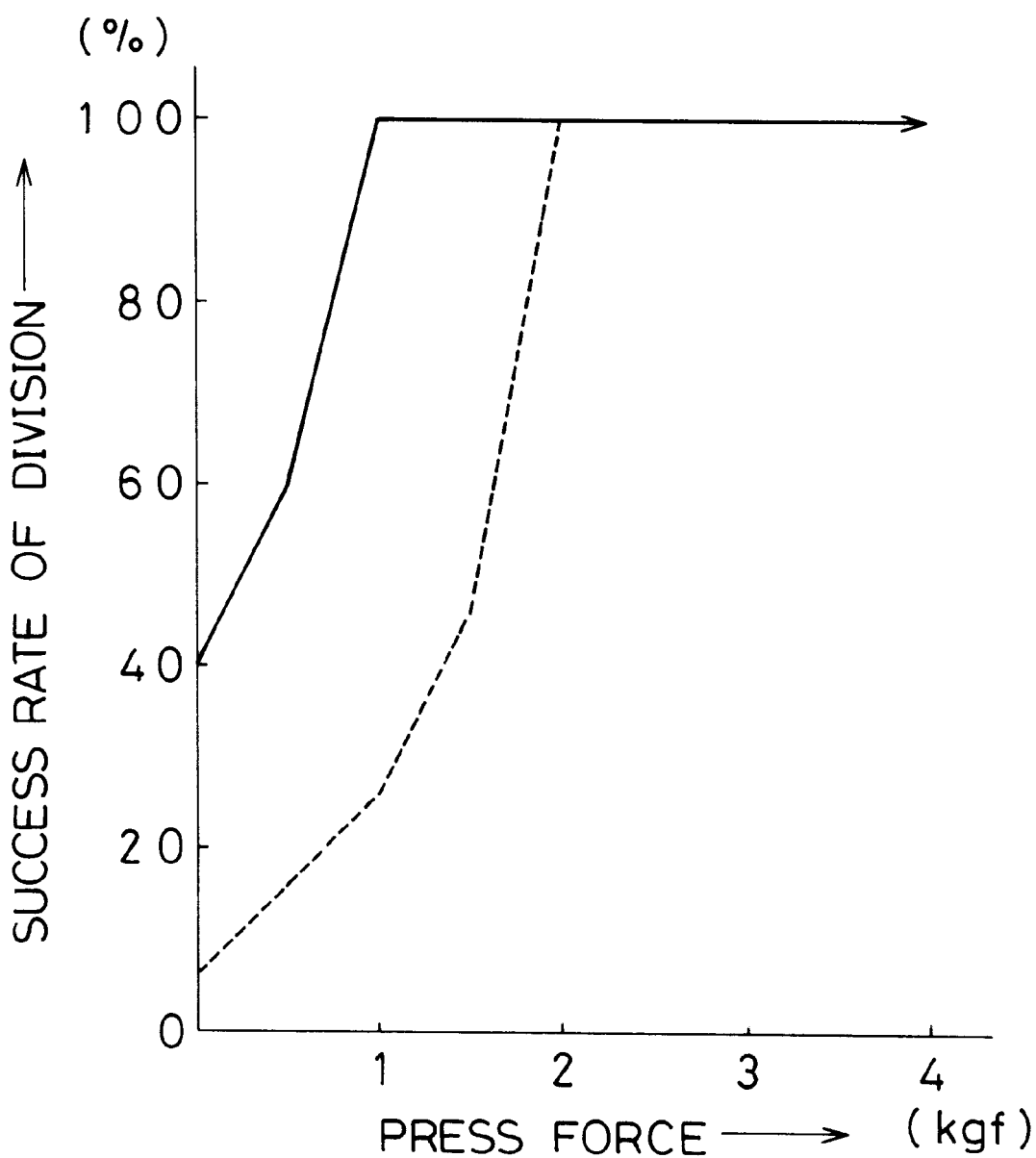
FIG. 5 is a graph showing the relationship between the success rate of division of ceramic board and the press force.

FIG. 5 is a graph showing the divisional rate when the ceramic board C is divided by using the breaking apparatus A of this embodiment. As apparent from FIG. 5, in this embodiment as indicated by a solid line, the division success rate has reached 40% even when the pressure of the press belt 31 is equal to zero, and the success rate reaches about 100% under the pressure of 1 Kgf.

Accordingly, by lowering the pressure force of the press belt 31, occurrence of a crack in the longitudinal direction can be prevented while keeping a high division success rate, and occurrence of loss can be prevented.

On the other hand, the division success rate of the conventional breaking apparatus (as indicated by a chain line) under the pressure of zero is equal to about 5%, and about 2 Kgf pressure is needed to increase the success rate to about 100%. Therefore, the probability that defects occur due to cracks in the longitudinal direction is increased.

Figure 6:
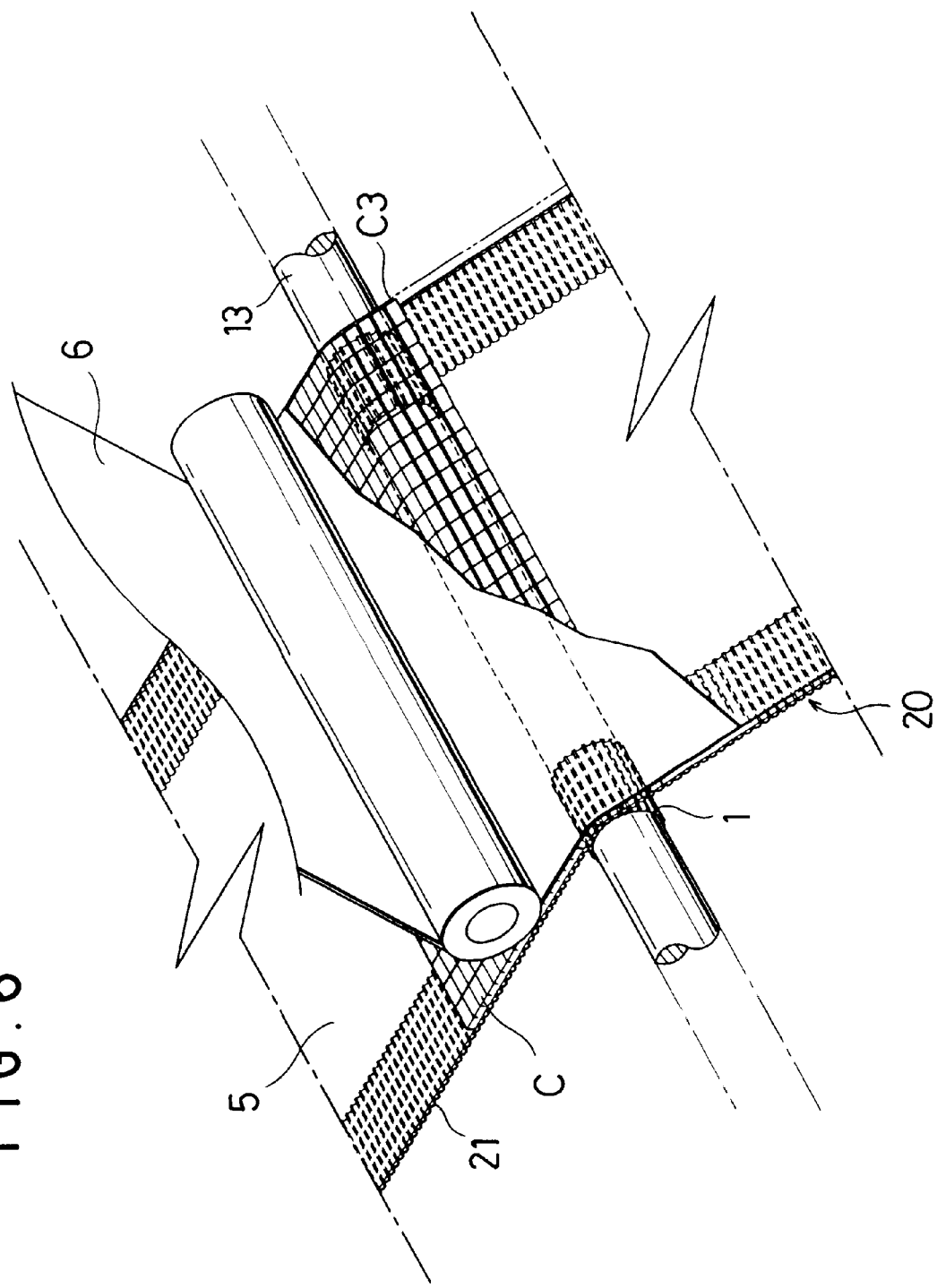
FIG. 6 is a diagram showing a breaking apparatus according to another embodiment.
Figure 7:
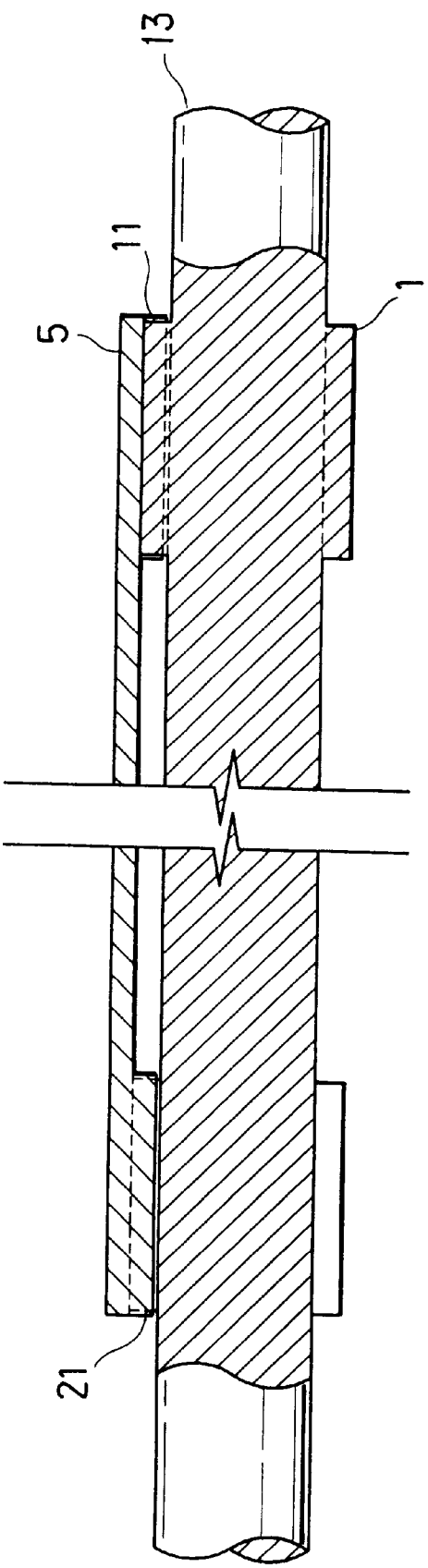
FIG. 7 is a cross-sectional view showing a breaking apparatus according to another embodiment.
Figure 8:
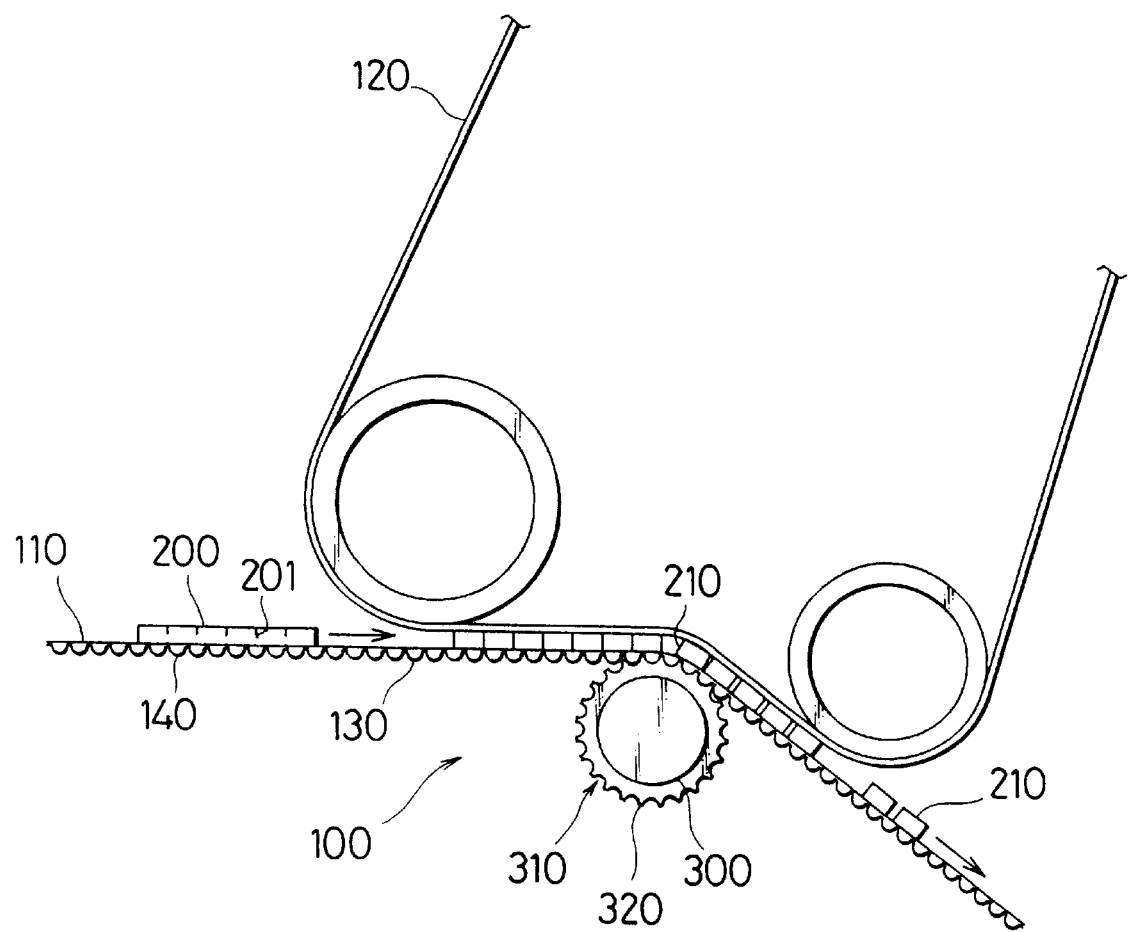
FIG. 8 is a side view showing a conventional breaking apparatus.
Figure 9:
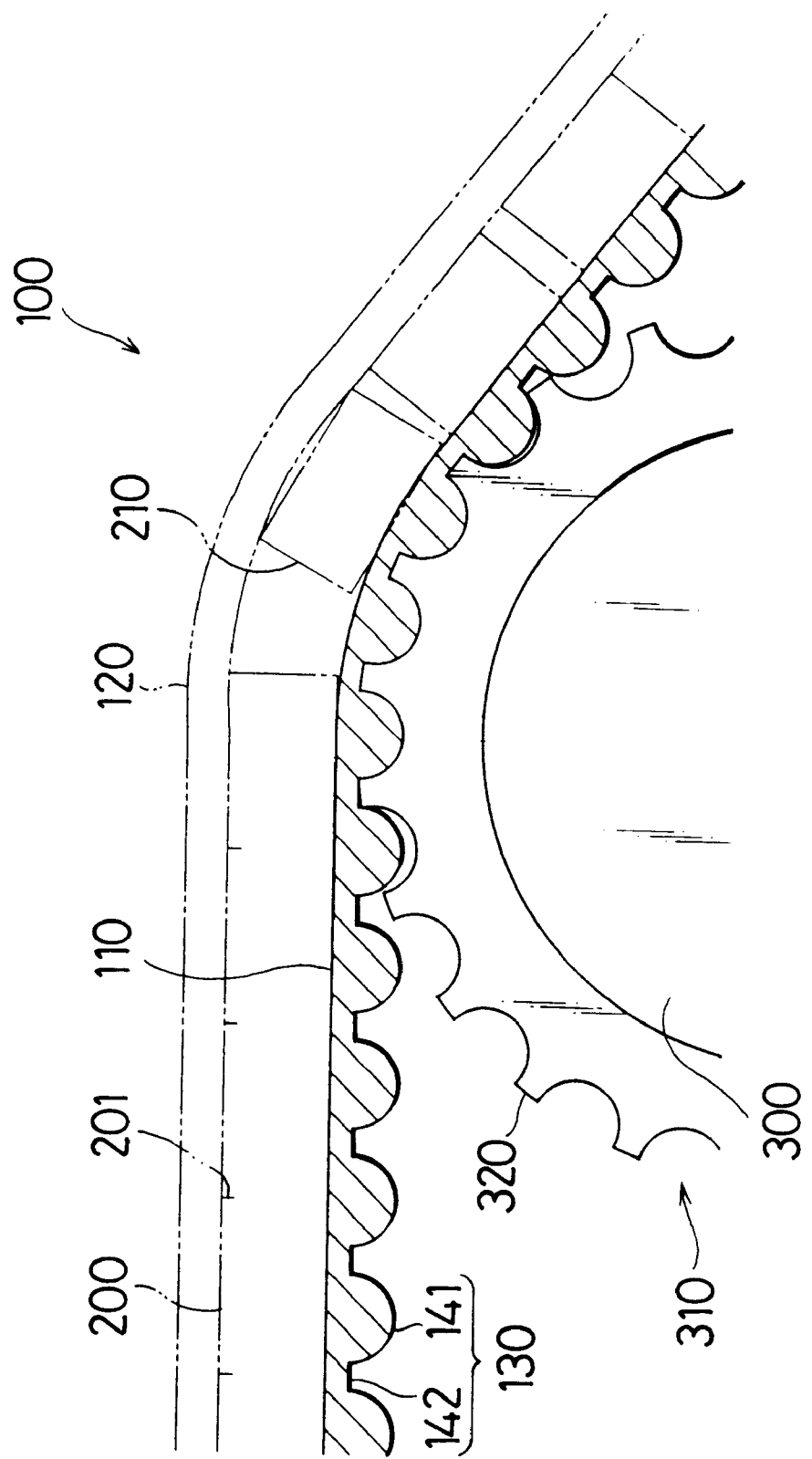
FIG. 9 is a side view showing a conventional feeding belt and a conventional break pulley.

In this embodiment, the breaking apparatus A has two right and left feeding belts 2 each comprising a toothed belt, and two right and left breaking pulleys 1 which are engaged with the respective feeding belts 2. However, as shown in FIGS. 6 and 7, in place of the two right and left feeding belts 2 may be used a wide toothed belt 5 having two tooth rows 20 on the back surface thereof, the teeth 21 in the tooth rows 20 being positionally arranged in an offset manner between the rows.

Further, one wide press belt 6 may be used in place of the two press belts 31, and in this case, the whole surface of the ceramic board C is pressed against the upper surface of the wide toothed belt 5.

As not shown, in place of the two right and left break pulleys 1 may be used a wide break pulley 7 having two tooth rows 10 which correspond to the two tooth rows 20 of the wide toothed belt 5, and in this case the teeth 11 of the tooth rows 10 are located so as to be arranged in an offset manner in the peripheral direction between the rows.

According to the present invention, the following effects can be achieved.

Plural rack-shaped tooth rows with many teeth are formed on the lower surface of the feeding belt, and plural pinion-shaped tooth rows each comprising teeth which are engaged with the teeth of the tooth rows of the feeding belt are provided on the peripheral surface of the break pulley. In addition, the engagement position between the teeth in the plural tooth rows of the feeding belt and the teeth in the plural tooth rows of the break pulley is arranged in an offset manner between the rows. Therefore, any break groove formed on the ceramic board before is located at a recess portion of any tooth row provided on the feeding belt in a high probability, so that the success rate of the division can be enhanced without applying a great breaking pressure.

A crack occurs at one end portion of a breaking groove quickly grows under the breaking pressure, and instantaneously reaches the other end portion of the break groove on the ceramic board. Therefore, it is unnecessary to generate cracks from both the end portions of the break groove, and the division of the breaking grooves can be surely performed with the above construction.

Further, the teeth in the tooth rows of the break pulley are located so as to be arranged in an offset manner between the rows in the peripheral direction, and also the teeth of the tooth rows of the feeding belt are located so as to be arranged in an offset manner between the rows, whereby the engagement position between each tooth of the plural tooth rows of the feeding belt and each tooth in the plural tooth rows of the break pulley can be easily arranged in an offset manner every row.

Therefore, the feeding belt comprises two right and left toothed belts, or a wide toothed belt having many tooth rows on the lower surface of the belt, and the break pulley comprises two right and left break pulleys disposed at right and left sides of the pulley shaft, or a wide break pulley having plural tooth rows on the peripheral surface of the pulley, thereby simply achieving the structure that the engagement position between the tooth row of the feeding belt and the tooth row of the break pulley is arranged in an offset manner every row.

Further, the press portion which can vary the press force of the feeding belt by the press belt is provided, whereby the minimum press force needed to obtain a sufficient division success rate can be set, and the loss due to longitudinal cracks of the ceramic board and the wearing of the break pulley and the feeding belt can be suppressed to the minimum level.

What is claimed is:

1. A breaking apparatus for a ceramic board, the ceramic board being composed of a number of bar-shaped boards, said breaking apparatus comprising:

press means provided above a feeding belt for pressing the ceramic board; and a break pulley pressed against a lower surface of the feeding belt to divide the ceramic board sandwiched between the feeding belt and the press means into said number of bar-shaped boards while the feeding belt is bent along a portion of a peripheral surface of the break pulley; wherein:

rack teeth in plural rows are provided on the lower surface of the feeding belt;

pinion teeth in plural rows are provided on the peripheral surface of the break pulley having a shape cooperatively meshing with said rack teeth thereby permitting each tooth of said pinion teeth thereof to engage with each tooth of said rack teeth on the feeding belt;

each tooth of said rack teeth in a one row provided on the feeding belt is deviated by a predetermined distance from each tooth thereof in another row provided on the feeding belt;

each tooth of said pinion teeth in a one row provided on the break pulley is deviated by a predetermined distance from each tooth thereof in another row provided on the break pulley;

said each tooth of said rack teeth in a one row provided on the feeding belt is disposed so as to engage with said each tooth of said pinion teeth in a one row provided on the break pulley, and said each tooth of said rack teeth in another row provided on the feeding belt is disposed so as to engage with said each tooth of said pinion teeth in another row provided on the break pulley; and said one row provided on said feeding belt is bent at a timing different from said another row provided thereon by deviating each tooth of said one row by a predetermined distance from each tooth of said another row.

2. The breaking apparatus as claimed in claim 1, wherein said one row of said teeth on the break pulley is deviated by a predetermined distance from said another row of said teeth thereon in the peripheral direction of the break pulley.

3. The breaking apparatus as claimed in claim 1 or 2, wherein:

said feeding belt comprises a first toothed belt and a second toothed belt, the lower surface of each toothed belt being provided with a row of teeth, and said break pulley is provided with plural rows of teeth on the peripheral surface thereof, said rows of teeth corresponding to said rows of each toothed belt.

4. The breaking apparatus as claimed in claim 3, wherein each tooth of the teeth in the row on the first toothed belt is deviated by ½ pitch from each tooth of the teeth in the row on the second toothed belt.

5. The breaking apparatus as claimed in claim 3, wherein:

said break pulley comprises a first break pulley and a second break pulley, said first and second break pulleys being disposed on both sides of a pulley shaft; and said first and second toothed belts are disposed so as for each tooth of the teeth in each row provided each on the lower surface of the first and second toothed belts to engage with each tooth of the teeth in each row provided on the first and second pulleys, respectively.

6. The breaking apparatus as claimed in claim 5, wherein each tooth of the teeth in each row provided on the break pulley is deviated by ½ pitch from one another.

7. The breaking apparatus as claimed in claim 1 or 2, wherein said press means comprises a press belt, and the press force on said feeding belt by said press belt is made adjustable.

8. The breaking apparatus as claimed in claim 1 or 2, wherein each tooth of the teeth in each row provided on the feeding belt is deviated by ½ pitch from one another; and each tooth of the teeth in each row provided on the break pulley is deviated by ½ pitch from one another.

9. The breaking apparatus as claimed in claim 1 or 2, wherein:
   said feeding belt comprises a wide toothed belt, the lower surface of said wide toothed belt being provided with plural rows of teeth, and
   said break pulley is provided with plural rows of teeth on the peripheral surface thereof, said tooth rows corresponding to said rows of teeth provided on said wide toothed belt.

10. The breaking apparatus as claimed in claim 9, wherein said wide toothed belt is provided with two rows of the teeth, including a first row of the teeth and a second row of the teeth, on the lower surface thereof.

11. The breaking apparatus as claimed in claim 10, wherein each tooth of the teeth in said first row on the feeding belt is deviated by ½ pitch from each tooth of the teeth in said second row thereon.

12. The breaking apparatus as claimed in claim 9, wherein each tooth of the teeth in each row provided on the feeding belt is deviated by ½ pitch from one another; and each tooth of the teeth in each row provided on the break pulley is deviated by ½ pitch from one another.

13. The breaking apparatus as claimed in claim 1 or 2, wherein said break pulley comprises a wide break pulley, and the surface of said break pulley is provided with plural rows of teeth which correspond to said plural rows of teeth provided on said toothed belt.

14. The breaking apparatus as claimed in claim 13, wherein said wide break pulley is provided with two rows of the teeth, including a first row of the teeth and a second row of the teeth, on the peripheral surface thereof.

15. The breaking apparatus as claimed in claim 14, wherein each tooth of the teeth in each row provided on the break pulley is deviated by ½ pitch from one another.

16. The breaking apparatus as claimed in claim 13, wherein each tooth of the teeth in each row provided on the break pulley is deviated by ½ pitch from one another.

17. The breaking apparatus as claimed in claim 1 or 2, wherein said break pulley comprises a first break pulley and a (left) second break pulley, and said first and second break pulleys are disposed at both sides of a pulley shaft, respectively.

18. The breaking apparatus as claimed in claim 17, wherein each tooth of the teeth in each row provided on the break pulley is deviated by ½ pitch from one another.

19. A breaking apparatus for breaking a ceramic board, having grooves, into a number of discrete bar-shaped boards, comprising:

a feeding belt arrangement including a bendable support structure on which the ceramic board is receivable, said bendable support structure being positioned to support the ceramic board at laterally spaced-apart positions therealong, the ceramic board when placed upon the bendable support structure of feeding belt arrangement being moved by the feeding belt arrangement in a feeding direction;

a mechanism for pressing the ceramic board against the bendable support structure of the feeding belt arrangement when received thereon and transported therealong in the feeding direction;

at least one break pulley pressed against a lower surface of the bendable support structure to create a bend therein running crosswise the feeding direction, a position of said break pulley corresponding to a region of bendable support structure pressed by the mechanism for pressing such that the ceramic board is made to conform to the bend while being moved in the feeding direction and broken along the grooves which are arranged crosswise to the feeding direction;

a surface of the bendable support structure opposite a board-reception side thereof including at least first and second rows of teeth each presenting an alternating protruding tooth portion and a bendable recess portion therebetween in said feeding direction;

a peripheral surface of each of said at least one break pulley including complementary structure corresponding to said first and second rows of teeth for engaging same; and said teeth in said second row of teeth being offset from said first row of teeth in said feeding direction by less than a pitch of said first and second rows of teeth.

20. The breaking apparatus according to claim 19, wherein:
   said bendable support structure comprises a first belt and a second belt laterally spaced apart from one another, the surface opposite the board-reception side of each of said first and second belts being provided with a respective one of first and second rows of teeth.

21. The breaking apparatus according to claim 19, wherein said bendable support structure comprises a wide belt, the surface opposite the board-reception side of said wide toothed belt being provided with said first and second rows of teeth at laterally spaced apart locations thereon.

22. The breaking apparatus according to claim 19, wherein the teeth in each of said first and second rows are deviated by ½ pitch from one another.

* * * * *